United States Patent
Yoo et al.

(10) Patent No.: US 10,168,626 B2
(45) Date of Patent: Jan. 1, 2019

(54) APPARATUS AND A METHOD OF FORMING A PARTICLE SHIELD

(71) Applicant: TAIWAN SEMICONDUCTOR MANUFACTURING COMPANY, LTD., Hsinchu (TW)

(72) Inventors: Chue San Yoo, Hsinchu (TW); Ching-Yueh Chen, Hsinchu (TW); Wen-Hao Cheng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/399,180

(22) Filed: Jan. 5, 2017

(65) Prior Publication Data

US 2017/0363974 A1    Dec. 21, 2017

Related U.S. Application Data

(60) Provisional application No. 62/351,764, filed on Jun. 17, 2016.

(51) Int. Cl.
| | | |
|---|---|---|
| G03B 27/52 | (2006.01) | |
| G03F 7/20 | (2006.01) | |
| H01L 21/67 | (2006.01) | |

(52) U.S. Cl.
CPC .......... *G03F 7/70916* (2013.01); *G03F 7/707* (2013.01); *G03F 7/70875* (2013.01); *H01L 21/67115* (2013.01); *H01L 21/67253* (2013.01)

(58) Field of Classification Search
CPC ............. G03F 7/70866; G03F 7/70875; G03F 7/70916; G03F 7/70933; G03F 7/70983; G03F 7/70358; G03F 7/70716; G03F 7/70858; G02B 27/0006
USPC .......................................................... 355/30
See application file for complete search history.

(56) References Cited

U.S. PATENT DOCUMENTS

| | | | |
|---|---|---|---|
| 6,921,613 B2 | 7/2005 | Enloe | |
| 7,138,640 B1 | 11/2006 | Delgado et al. | |
| 9,513,566 B2 | 12/2016 | Bal et al. | |
| 9,632,437 B2 | 4/2017 | Park et al. | |
| 2003/0006380 A1* | 1/2003 | Van Empel | G03F 7/70716 |
| | | | 250/492.3 |
| 2005/0199829 A1* | 9/2005 | Partlo | B82Y 10/00 |
| | | | 250/504 R |
| 2005/0275835 A1 | 12/2005 | Sogard | |
| 2006/0119811 A1 | 6/2006 | Simon | |

(Continued)

FOREIGN PATENT DOCUMENTS

| | | |
|---|---|---|
| EP | 1098226 | 5/2001 |
| EP | 1326139 | 7/2003 |

(Continued)

*Primary Examiner* — Peter B Kim
(74) *Attorney, Agent, or Firm* — Haynes and Boone, LLP (57) ABSTRACT

An apparatus for generating at least one particle shield. The at least one particle shield includes a first component and a second component. The first component and the second component are usable to form a first particle shield of the at least one particle shield for blocking particles from contacting a proximate surface of an object, the first particle shield is substantially parallel to and physically separated from the proximate surface of the object, and the first particle shield includes an energy gradient force or a velocity gradient force.

20 Claims, 6 Drawing Sheets

(56) References Cited

U.S. PATENT DOCUMENTS

| | | |
|---|---|---|
| 2007/0285632 A1 | 12/2007 | Phillips et al. |
| 2007/0298362 A1 | 12/2007 | Rocha-Alvarez et al. |
| 2009/0207394 A1* | 8/2009 | Shibazaki ............... G03F 7/707 355/53 |
| 2011/0228239 A1 | 9/2011 | Gosen et al. |
| 2014/0322897 A1 | 10/2014 | Samir et al. |

FOREIGN PATENT DOCUMENTS

| | | |
|---|---|---|
| JP | 2004214552 | 7/2004 |
| TW | 201202862 | 1/2012 |
| WO | WO 2008/046035 | 4/2008 |

* cited by examiner

APPARATUS AND A METHOD OF FORMING A PARTICLE SHIELD

PRIORITY CLAIM

The instant application is a non-provisional application claiming priority to Provisional Application No. 62/351,764, filed Jun. 17, 2016, the entire content of which is incorporated by reference herein.

BACKGROUND

Semiconductor manufacturing includes various processes such as photolithography, etching, and diffusion. Functional density has increased by decreasing a geometric size of components for integrated chips. Such scaling down process enhances production efficiency and lowers associated manufacturing costs. Removing debris and by-products from equipment, photomasks and wafers helps to improve production yield.

In some approaches, a cleaning solvent such as deionized water is sprayed on a surface to remove particles accumulated on the surface. In some approaches, a solid shield is installed on a wafer transportation/storage pad during the manufacturing processes. In some approaches, loading and unloading of wafers are performed automatically by a sealed input/output tool such as a standard mechanical interface (SMIF) apparatus. In some approaches, clothing of a process operator is cleaned to reduce contamination from particles introduced into a manufacturing environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photolithography is a process by which a pattern on a photomask is transferred to a substrate or a layer on the substrate. The photomask, a frame and a pellicle are collectively referred to as a mask system. The frame holds the photomask and the pellicle comprises a transparent thin film over the frame. The pellicle protects the photomask and helps to prevent particles from entering a focal point of light passing through the photomask. Particles are introduced into the photolithography apparatus due to the removal of the photomask from a chuck, or material removal from the substrate or the layer on the substrate, or by other contaminants present in the manufacturing environment. Particles in an optical path of light passing through the photomask disperse light which is incident on the particles. This light dispersion degrades the quality of the pattern imparted by the light beam through the photomask. The particles also adhere on surfaces of the substrate (or the layer on the substrate), manufacturing equipment or measuring system. Particles on the substrate or on the layer of the substrate potentially block light from the photomask from being incident on the substrate (or the layer on the substrate) and prevent precise transfer of the pattern of the photomask. Particles on a surface of manufacturing equipment or measuring system also potentially disperse light contacting those elements and reduce precision of the pattern transfer. In at least one embodiment, a shielding apparatus helps prevent particles from adhering to the surfaces or removes the particles from the surfaces or the optical path during the manufacturing processes and, in turn, improves manufacturing yield.

Figure 1A:
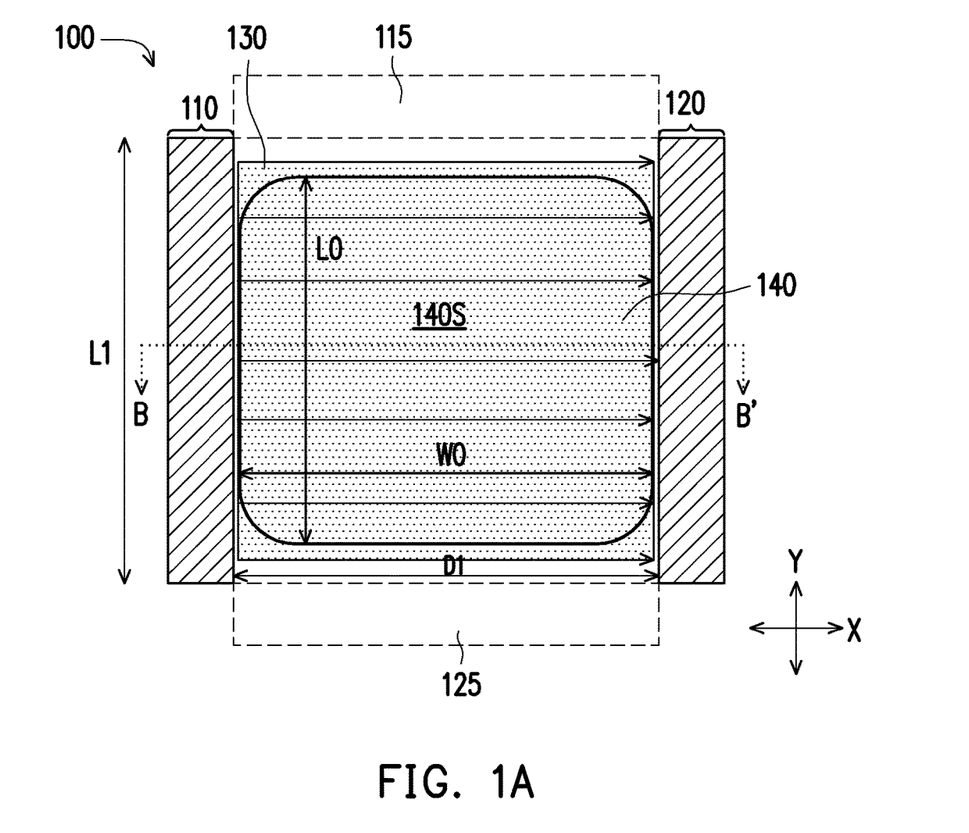
FIG. 1A is a top view of an apparatus for generating a particle shield in accordance with one or more embodiments.

FIG. 1A is a top view of an apparatus 100 for generating a particle shield 130, also referred to as a particle shield generator, in accordance with one or more embodiments. Apparatus 100 includes a first component 110 and a second component 120. Apparatus 100 is configured to generate particle shield 130 between first component 110 and second component 120. In order to help prevent particles or contaminants from falling onto or contacting a surface 140S of an object 140, particle shield 130 (symbolized by arrows) overlaps and is physically separated from surface 140S. In some embodiments, particle shield 130 is invisible to the human eye. In some embodiments, object 140 is a substrate, a photomask, a wafer, or an inner wall of a carrier. In some embodiments, the substrate or the wafer includes one or more additional layer over the substrate or the wafer. In some embodiments, the combination of the substrate and the additional layer is collectively referred to as the substrate. In some embodiments, the combination of the wafer and the additional layer is collectively referred to as the wafer. In some embodiments, object 140 is a selected component in a manufacturing system, such as a reticle edge masking assembly (REMA), an illumination aperture or a lens in a scanner system. In some embodiments, surface 140S has a rectangular shape defined by a length L0 and a width W0, corresponding to a length L1 and a distance D1 of particle shield 130. In order to substantially cover surface 140S, length L1 is equal to or longer than length L0, and distance D1 is equal to or longer than width W0. As a result, an area of particle shield 130 is equal to or greater than an area of surface 140S. In some embodiments, length L1 and distance D1 range between from about 127 millimeters (mm) to about 305 mm. Longer length L1 or longer Distance D1 as well as shorter length L1 or shorter distance D1 increase the difficulty of controlling particle shield 130, in some instances.

In some embodiments, both first component 110 and second component 120 are fixed relative to surface 140S. In some embodiments, at least one of first component 110 or second component 120 is movable relative to surface 140S. In at least one embodiment, a movement is along a direction X, which is parallel to distance D1. In at least one embodiment, a movement is along a direction Y, which is parallel to length L1. Direction X and direction Y are parallel to surface 140S. A longitudinal axis of first component 110 is parallel to a longitudinal axis of second component 120. In some embodiments, the longitudinal axis of first component 110 and the longitudinal axis of second component 120 are parallel to surface 140S. In some embodiments, at least one of first component 110 or second component 120 is movable along a direction Z orthogonal to surface 140S.

In some embodiments, first component 110 and second component 120 are physically coupled to each other, either directly or through other hardware (not shown). In some embodiments, first component 110 and second component 120 are physically separated from each other. Apparatus 100 includes first component 110 and second component 120 on opposite sides of object 140; however, in some embodiments, first component 110 and second component 120 have a different arrangement with respect to object 140 in order to protect other surfaces. In some embodiments, apparatus 100 also includes a third component 115 and a fourth component 125. In some embodiments, third component 115 and fourth component 125 are positioned transverse to first component 110 and second component 120. In some embodiments, apparatus 100 is operable to form an additional particle shield between third component 115 and fourth component 125. In some embodiments, third component 115 and fourth component 125 provide a redundant apparatus in case first component 110 or second component 120 fails, in such a way, the additional particle shield is positioned to be substantially co-planar with particle shield 130. In some embodiments, third component 115 and fourth component 125 provide an additional particle shield to enhance the protection, in such a way; the additional particle shield is above or below particle shield 130. In some embodiments, first component 110 and second component 120 are usable to form particle shield 130 simultaneously with third component 115 and fourth component 125 forming the additional particle shield. In some embodiments, first component 110 and second component 120 are usable to form particle shield 130 before or after third component 115 and fourth component 125 forms the additional particle shield.

Figure 1B:
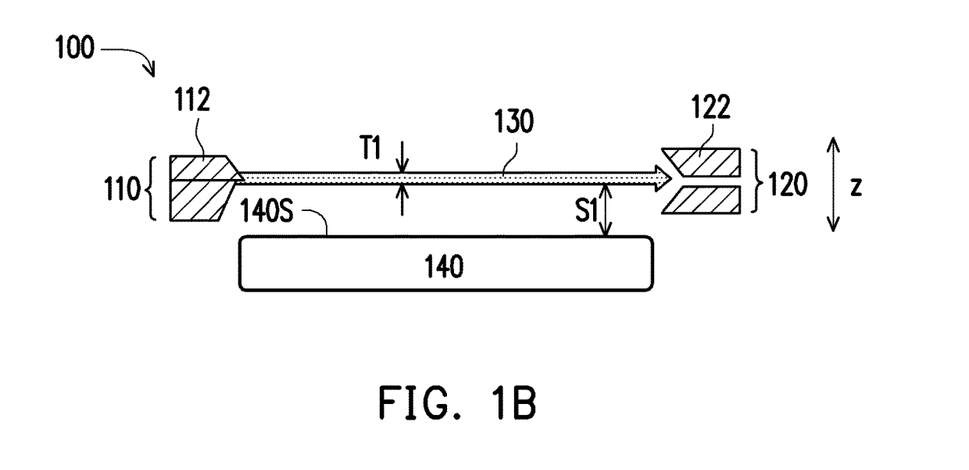
FIGS. 1B and 1B' are cross-sectional views of the apparatus for generating the particle shield taken along line B-B' in FIG. 1A in accordance with one or more embodiments.

In some embodiments, at least one of the axis of first component 110 or the axis of second component 120 is tilted relative to surface 140S (as shown in FIG. 1B'). An angle of the tilting θ ranges from greater than 0 degrees to about 45 degrees, which is adjustable based on the area of surface 140S and a working environment.

FIG. 1B is a cross-sectional view of apparatus 100 for generating particle shield 130 taken along line B-B' in FIG. 1A in accordance with one or more embodiments. In some embodiments, first component 110 includes at least a gas injector 112. In at least one embodiment, gas injector 112 is called an air knife or an air jet. In some embodiments, particle shield 130 is blown out of gas injector 112 into a space by the Coanda effect, which describes an adherence of fluid when close to a surface, resulting in an asymmetric expansion. In some embodiments, particle shield 130 is formed by compressing or pumping a gas from gas injector 112. In some embodiments, a gas supply is connected to gas injector 112 by a connecting pipe (not shown). In some embodiments, particle shield is generated by a pressure difference between first component 110 and second component 120. Gas injector 112 injects and provides fluid dynamic control of particle shield 130, a protective gas stream flowed into a space between first component 110 and second component 120. In some embodiments, particle shield 130 is a gas curtain including an inert gas such as argon or helium. In some embodiments, particle shield 130 includes ambient air, nitrogen, hydrogen, or combinations thereof.

In some embodiments, second component 120 includes at least a gas extractor 122. In at least one instance, gas extractor 122 and gas injector 112 are aligned at the same level in a direction Z, which is parallel to the normal line of surface 140S. In some embodiments, gas extractor 122 is above or below gas injector 112 in direction Z. In at least one embodiment, gas extractor 122 draws particles output by gas injector 112 as well as other particles which pass between gas injector 112 and gas extractor 122. In some embodiments, gas extractor 122 includes a vacuum. Gas injector 112 and gas extractor 122 work together to provide an adequate air pressure gradient, even in a vacuum environment, for particle shield 130 to help prevent particles or contaminants from reaching surface 140S. In some embodiments, during operation, particle shield 130 is circulated through gas injector 112 and gas extractor 122. In some embodiments, instead of gas extractor 122, second component 120 optionally includes an air receiver for passively receiving particle shield 130 formed by gas from gas injector 112.

Particle shield 130 is separated from surface 140S by a spacing S1 ranging from about 0.5 mm to about 30 centimeters (cm). Larger spacing S1 reduces a functionality of particle shield 130 because increased space between particle shield 130 and surface 140S will permit particles to enter into spacing S1 from direction X or direction Y for a longer distance, in some instances. Shorter spacing S1 increases a risk of a contact between particle shield 130 and surface 140S, in some instances.

Particle shield 130 has a thickness T1 above surface 140S. Thickness T1 ranges from about 1 mm to about 90 mm. Due to a low density of particle shield 130, thicker thickness T1 reduces a functionality of particle shield 130, in some instances. In some embodiments, thickness T1 is substantially uniformly distributed between first component 110 and second component 120. In some embodiments, thickness T1 increases from first component 110 to second component 120.

In some embodiments, first component 110 includes two or more air injectors 112 positioned side by side, i.e., along direction Y, or one over another, i.e., along direction Z. In some embodiments, when positioned side by side, an outlet of each gas injector 112 is formed in a nozzle shape. In some embodiments, when positioned one over another, an outlet of each gas injector 112 is formed in a slot shape extending in direction Y. In some embodiments, in order to provide additional gas extraction, second component 120 includes two or more gas extractors 122.

Figure 1C:
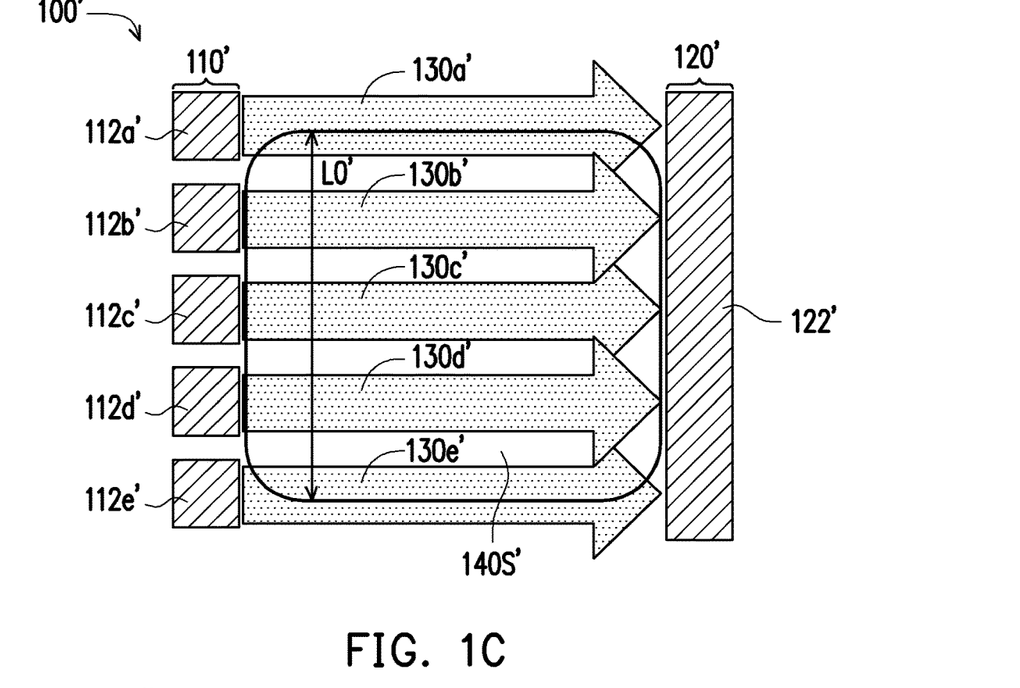
FIG. 1C is a top view of an apparatus for generating a plurality of particle shields in accordance with one or more embodiments.

FIG. 1C is a top view of an apparatus 100' for generating a plurality of particle shields 130a', 130b', 130c', 130d' and 130e' in accordance with one or more embodiments. Apparatus 100' is similar to apparatus 100, like elements have a same reference number with a prime symbol. First component 110', corresponding to another embodiment of first component 110, includes plural gas injectors 112a', 112b', 112c', 112d' and 112e', and second component 120', corresponding to another embodiment of second component 120, includes gas extractor 122'. Plural particle shields 130a'-130e' are generated between gas injectors 112a'-112e' and gas extractor 122'. In some embodiments, gas extractor 122' includes a plurality of gas extractors, where each gas extractor corresponds to one of gas injectors 112a'-112e'. Similar to apparatus 100 in FIG. 1B, a combined area of particle shields 130a'-130e' is equal to or greater than surface 140S'. In some embodiments, every particle shield 130a'-130e' includes a same gas. In some embodiments, at least one of particles shields 130a'-130e' includes a different gas from a gas of at least one other of particle shields 130a'-130e'.

Figure 1D:
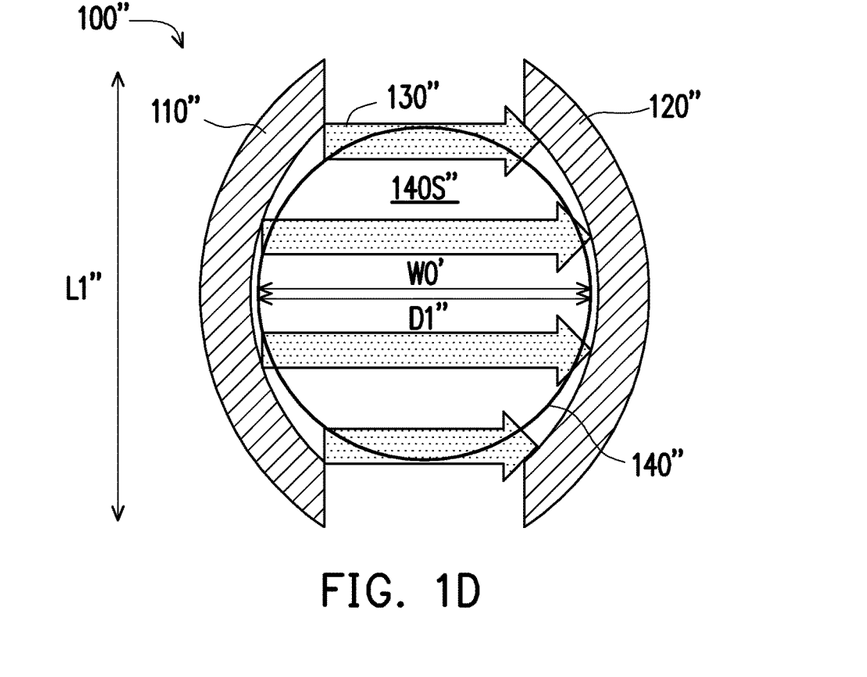
FIG. 1D is a top view of an apparatus for generating a particle shield in accordance with one or more embodiments.

FIG. 1D is a top view of an apparatus 100" for generating a particle shield 130" in accordance with one or more embodiments. Apparatus 100" is similar to apparatus 100, like elements have a same reference number with a double prime symbol. Apparatus 100" includes a first component 110" and a second component 120". First component 110" and second component 120" have a curved shape. Particle shield 130" is generated between first component 110" and second component 120". Particle shield 130" helps prevent contaminants from reaching a surface 140S" of object 140". In some embodiments, surface 140S" has a circular shape defined by a diameter W0" and particle shield 130" has an oval shape covering surface 140S". A length L1" and a distance D1" are therefore determined based on surface 140S". In order to substantially cover surface 140S", each of length L1" and distance D1" is equal to or longer than diameter W0". For example, for a 300-mm (12 inches) wafer, each of length L1" and distance D1" is equal to or greater than 300 mm (12 inches).

Figure 2A:
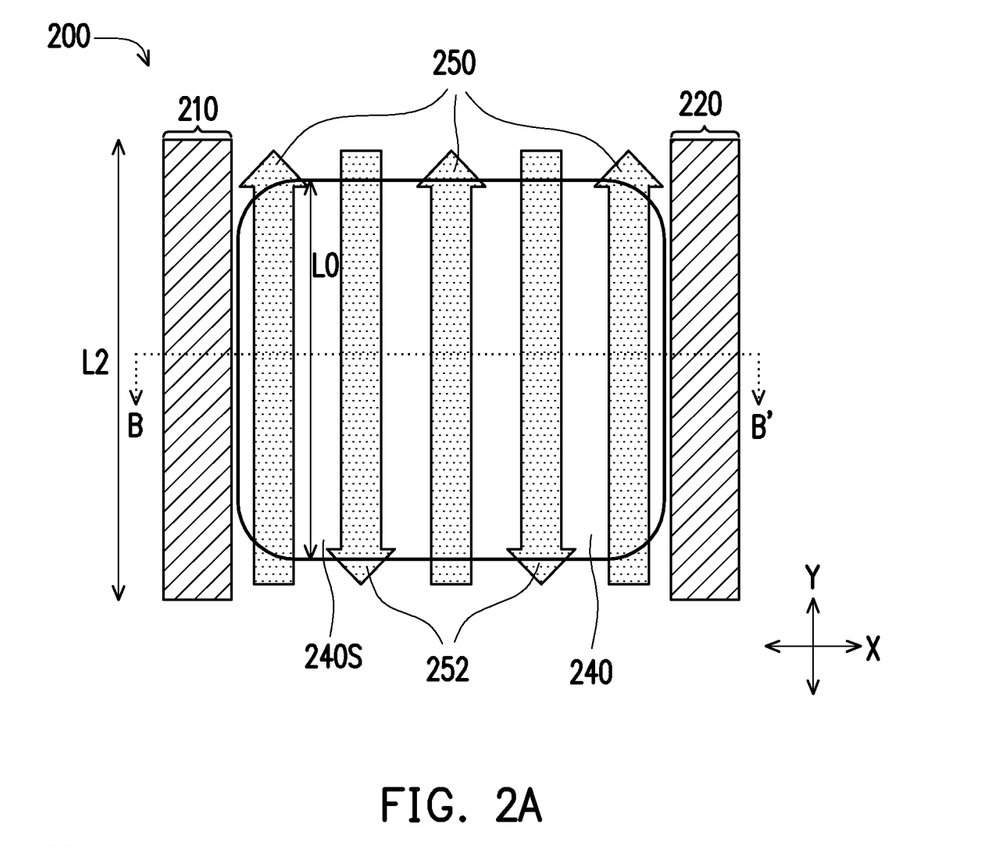
FIG. 2A is a top view of an apparatus for generating a particle shield in accordance with one or more embodiments.

FIG. 2A is a top view of an apparatus 200 for generating a particle shield 230, also referred to as a particle shield generator, in accordance with one or more embodiments. Apparatus 200 is similar to apparatus 100, like elements have a same reference number increased by 100. Apparatus 200 includes a first component 210 and a second component 220. Apparatus 200 is configured to generate particle shield 230 (best seen in FIG. 2B) between first component 210 and second component 220. In at least one embodiment, particle shield 230 is a magnetic field. In some embodiments, first component 210 and/or second component 220 have electromagnets or permanent magnets. In some embodiments, parameters in the design of positioning, spacing and strength of particle shield 230 configuration are computationally optimized based on electromagnetics and the dimensions of the surface area to be protected from particle contamination. In some embodiments, length L2 ranges from about 127 mm to about 305 mm. In some embodiments, the magnetic strength ranges from about 0.5 to 1.4 (Tesla) or larger. The smaller magnetic strength reduces a protective function of particle shield 230, in some instances. In some embodiments, particle shield 230 exerts a velocity dependent force such as a Lorentz force caused by an interaction between the magnetic field and at least one moving charged particle.

A first force 250 and a second force 252 are in opposite directions along direction Y. Under the electromagnetic field Lorentz force, when approaching particle shield 230, charged particles or contaminants will be driven away from an area of a surface 240S of an object 240 along direction Y. The Lorentz force is perpendicular to both a velocity of the charged particle and a magnetic field, i.e., particle shield 230, with direction given by the right hand rule. The force is given by the charge times the vector product of velocity and magnetic field. Positive charged particles are forced in a first direction and negative charged particles are forced in a second direction opposite the first direction. For example, when a negative charged particle contacts particle shield 230, the negative charged particle is driven by second force 252. In some embodiments, a length L2 of first component 210 is equal to or greater than length L0 of surface 240S. A magnitude of first force 250 or second force 252 is large enough to push charged particles away from surface 240S.

Figure 2B:
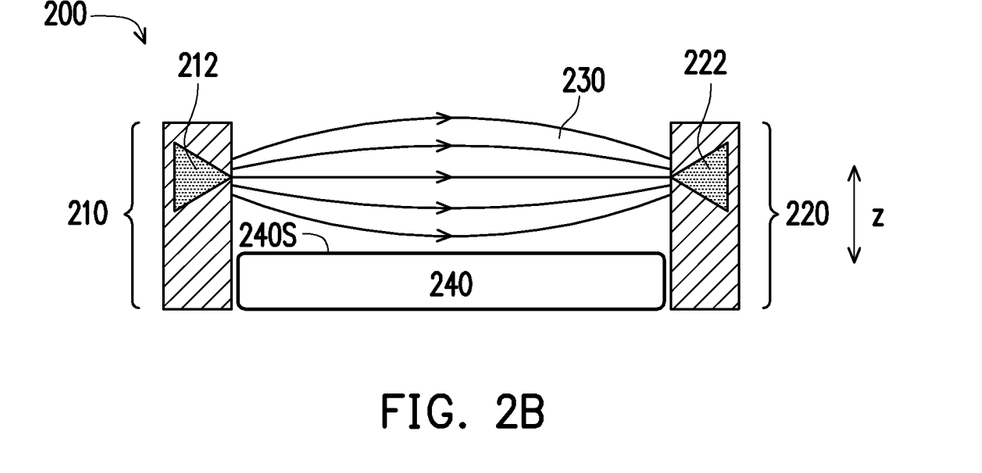
FIG. 2B is a cross-sectional view of the apparatus for generating the particle shield taken along line B-B' in FIG. 2A in accordance with one or more embodiments.

FIG. 2B is a cross-sectional view of apparatus 200 for generating particle shield 230 in accordance with one or more embodiments. In some embodiments, particle shield 230 comprises another energy gradient force, such as a thermal gradient driving force generated by a temperature difference. In at least one instance, first component 210 has a higher temperature than second component 220, resulting in a particle movement from first component 210 to second component 220. In some embodiments, first component 210 includes a North Pole magnet 212 and second component 220 includes a South Pole magnet 222. Particle shield 230 is the magnetic field symbolized by arrows. In some embodiments, surface 240S is closer to magnets 212 and 222 along direction Z so that object 240 is encompassed in particle shield 230.

Figure 2C:
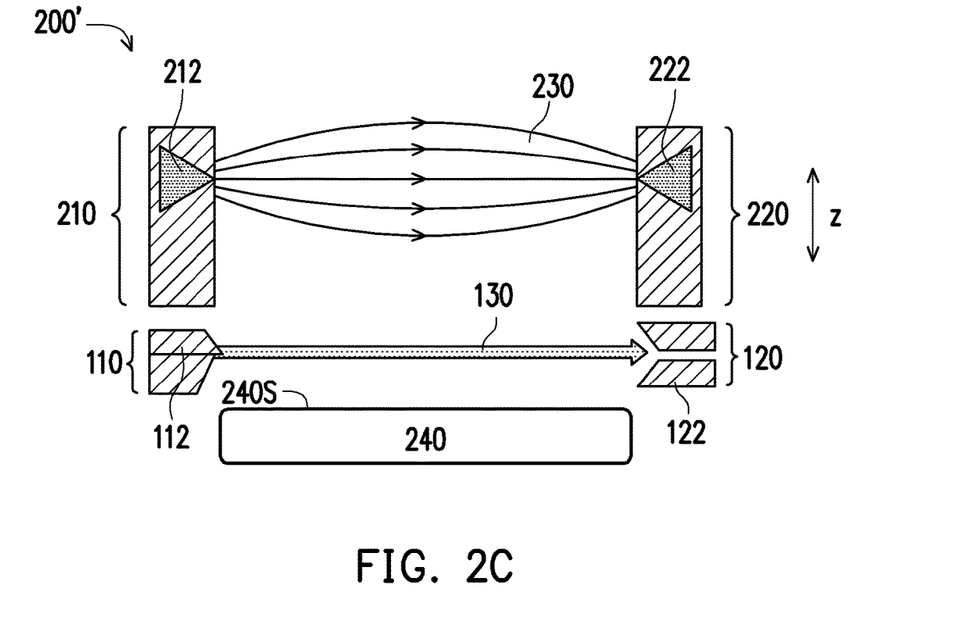
FIG. 2C is a cross-sectional view of an apparatus for generating a particle shield in accordance with one or more embodiments.

FIG. 2C is a cross-sectional view of an apparatus 200' for generating one or more particle shields in accordance with one or more embodiments. In some embodiments, a combination of the energy gradient force and the velocity dependent force is used to enhance protection from particles. For example, first component 210 including North Pole magnet 212 is above first component 110 including gas injector 112; second component 220 including South Pole magnet 222 is above second component 120. In some embodiments, first component 110 and second component 120 are above first component 210 and second component 220. Alternatively, first component 110 and second component 120 are positioned transverse to first component 210 and second component 220 similar to third component 115 and fourth component 125 in apparatus 100. In contrast with apparatus 100, because there is no interaction between the gas and magnetic field, particle shield 130 is co-planar with particle shield 230, in some embodiments.

In some embodiments, both the energy gradient force and the velocity dependent force are generated from a same component. For example, first component 210 and second component 220 are used to generate an air curtain as well as a magnetic field. One of ordinary skill in the art would understand that first component 210 or second component is not limited to an air curtain or a magnetic field. In at least one embodiment, at least one of first component 210 and second component 220 is used to generate an optical laser to burn the particles. In some embodiments, apparatus 200' includes more than two particle shields, such as a combination of an air curtain, a magnetic field and a thermal gradient driving force.

Figure 3:
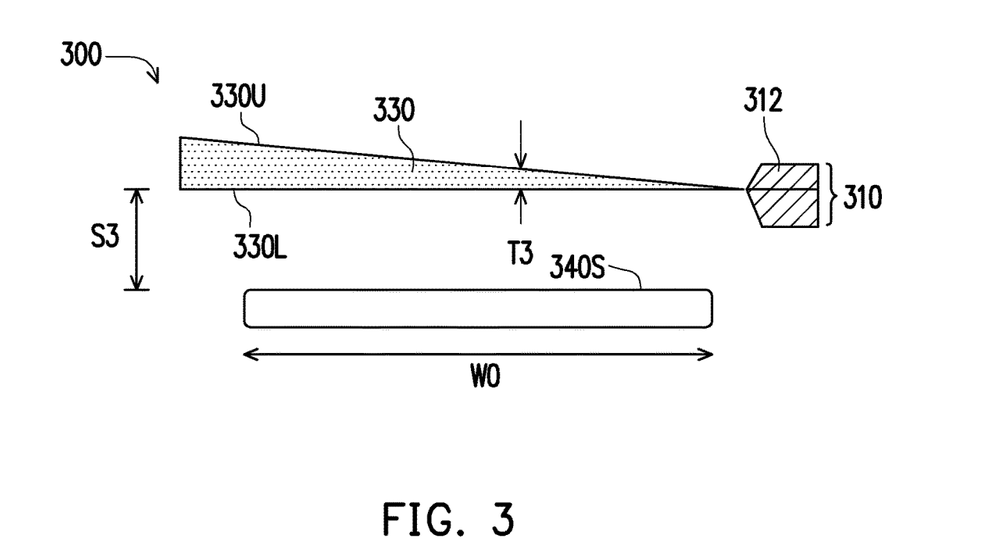
FIG. 3 is a schematic cross-sectional view of an apparatus for generating a particle shield in accordance with one or more embodiments.

FIG. 3 is an enlarged schematic view of an apparatus 300 for generating a particle shield 330, also referred to as a particle shield generator, in accordance with one or more embodiments. Apparatus 300 is similar to apparatus 100, like elements having a same reference number increased by 200. Apparatus 300 includes a first component 310. In some embodiments, first component 310 is a gas injector 312. Gas injector 312 generates particle shield 330, which includes an upper surface 330U and a lower surface 330L. A thickness T3 of particle shield 330 is defined by a distance between upper surface 330U and lower surface 330L. In various embodiments, a particle shield 330 provides an air curtain in direction X along width W0 to help block particles and thickness T3 is modified by several parameters such as gas density, molecular weight, and velocity of gas fluid. In some embodiments, thickness T3 ranges from about 1 mm to about 90 mm. For example, at an end of particle shield 330 extending to 152 mm (6 inches), thickness T3 ranges from 25.4 mm to around 38.1 mm. Due to a low density of particle shield 330, thicker thickness T3 reduces a functionality of particle shield 330, in some instances. In some embodiments, upper surface 330U is substantially tilted up and has an angle ranging from about 5-degrees to about 11-degrees above direction X and lower surface 330L is parallel to a surface 340S. Incoming particles are pushed away from surface 340S. Due to a large gradient, particle shield 330 is likely to contact an edge of surface 340S, in some instances. In order to help prevent lower surface 330L of particle shield 330 from contacting surface 340S, component 310 is designed to maintain a spacing S3 between lower surface 330L and surface 340S and may be larger than a maximum value of thickness T3.

In comparison with apparatus 100, apparatus 300 does not include a second component. The second component is omitted from apparatus 300 because a force of the gas ejected from first component 312 is sufficiently strong to block particles without the added assistance of the second component. In some embodiments, a device housing apparatus 300 and surface 340S has an opening across from first component 312 to permit particles to be forced out of the device. In some embodiments, apparatus 300 includes the second component. In some embodiments, first component 312 is separated into multiple first components as in apparatus 100' (FIG. 1C).

Figure 4:
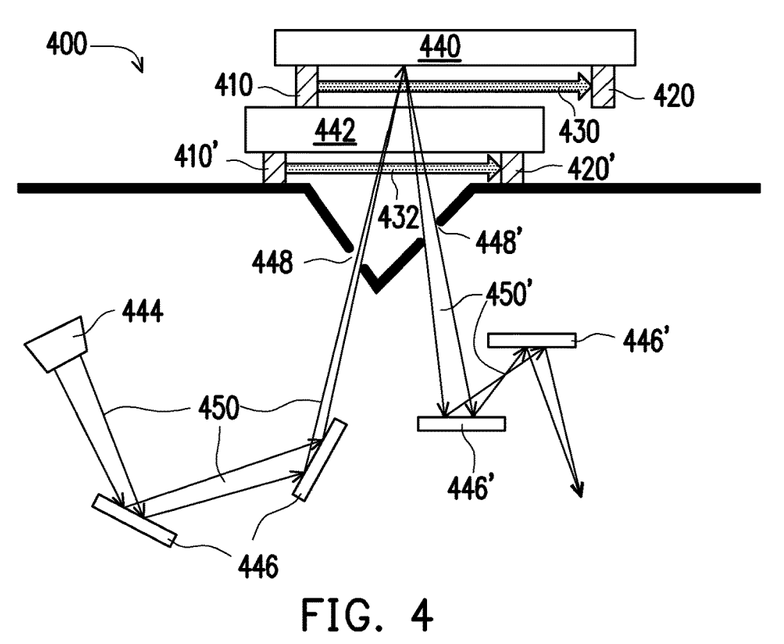
FIG. 4 is a schematic view of a photolithography system in accordance with one or more embodiments.

FIG. 4 is a schematic view of a photolithography system 400 in accordance with one or more embodiments. Photolithography system 400 includes an apparatus for generating a particle shield similar to apparatus 100 (or apparatus 100', 100", 200, 200' and 300), last two digits of like elements are the same. Photolithography system 400 includes a photomask 440, a slit 442, a radiation source 444, a plurality of reflectors or mirrors 446 and 446' and a set of apertures 448 and 448'. A beam of optical energy 450 is generated by radiation source 444, propagates along an optical path to reflectors 446, aperture 448 and slit 442 to photomask 440. Optical energy 450 is reflected by photomask 440, and propagates through slit 442, aperture 448' and reflectors 446'. Reflectors 446' reduce an image from photomask 440 for forming an image onto a wafer. In some embodiments, a distance between photomask 440 and slit 442 ranges from about 10 mm to about 100 mm. Apparatus 400 includes a catoptric imaging system. In some embodiments, apparatus 400 includes a catadioptric imaging system.

Photolithography system 400 further includes a first component 410, a second component 420, a third component 410' and a fourth component 420'. A first particle shield 430 is between first component 410 and second component 420. A second particle shield 432 is between third component 410' and fourth component 420'. First component 410 and second component 420 are between photomask 440 and slit 442. Third component 410' and fourth component 420' are between slit 442 and apertures 448 and 448'. Both first particle shield 430 and second particle shield 432 help prevent particles or contaminants from adhering or falling onto photomask 440 and/or slit 442. In some embodiments, both first particle shield 430 and second particle shield 432 include a gas stream. For example, first particle shield 430 and second particle shield 432 includes hydrogen, ambient air, helium, nitrogen or inert gases. In some embodiments, first particle shield 430 and second particle shield 432 include different gases. In some embodiments, a size of first particle shield 430 and second particle shield 432 ranges from four inches by four inches to six inches by six inches. In some embodiments, a size of first particle shield 430 and second particle shield 432 is greater than six inches by six inches. In some instances, a greater size of first particle shield 430 increases a size of photomask container. In some instances, a greater size of first particle shield 430 cannot fit in photolithography system 400. A smaller size causes the coverage for photomask 440 to be insufficient to block particles from contacting photomask 440. In some embodiment, a thickness of first particle shield 430 and second particle shield 432 ranges from about 1 mm to about 35 mm. In some embodiments, first particle shield 430 and second particle shield 432 include a combination of the energy gradient force and the velocity dependent force. For example, first particle shield 430 includes a gas and second particle shield 432 includes an electromagnetic Lorenz force. In various embodiments, depending on a requirement of cleanliness, one or more sets of components for generating particles shields are positioned proximate a surface of any of radiation source 444, reflectors 446, 446', apertures 448, 448' or the wafer. In some embodiments, photolithography system 400 includes apparatus 100, 100', 100", 200, 200', 300, or combinations therefor.

In some embodiments, photolithography system 400 is an extreme ultraviolet (EUV) exposure scanner and slit 442 is a REMA. In some instances, photomask 440 is also called a reticle or a mask. In some embodiments, radiation source 444 is created by plasma when a laser illuminates a gas, such as a supersonic jet of xenon gas. For example, radiation source 444 provides EUV radiation having a wavelength of approximately 13.5 nm. In some embodiments, when first particle shield 430 and second particle shield 432 include gas, a transmission loss between the beam of optical energy 450 and 450' ranges from about 0.011% to about 0.022%. In some embodiments, the gas has a low absorption of optical energy 450. A greater transmission loss reduces the exposure of layout patterns on the wafer. In some embodiments, photolithography system 400 is an X-Ray lithography, an ion beam projection lithography, or an electron-beam projection lithography.

Figure 5:
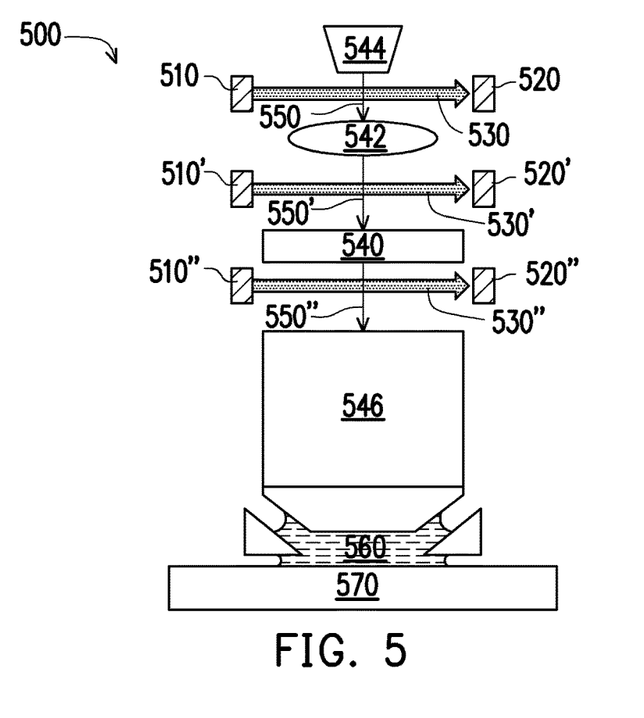
FIG. 5 is a schematic view of a photolithography system in accordance with one or more embodiments.

FIG. 5 is a schematic view of a photolithography system 500 in accordance with one or more embodiments. Photolithography system 500 includes an apparatus similar to apparatus for generating a particle shield 100 (or apparatus 100', 100", 200, 200' and 300), last two digits of like elements having a same reference number are the same. Photolithography system 500 includes a photomask 540, a lens 542, a radiation source 544, an imaging module 546 and fluid 560. A first component 510, a second component 520 and a first particle shield 530 are between radiation source 544 and lens 542. A third component 510', a fourth component 520' and a second particle shield 530' are between lens 542 and photomask 540. A fifth component 510", a sixth component 520" and a third particle shield 530" are between photomask 540 and imaging module 546. Radiation source 544 emits a beam of optical energy 550 through first particle shield 530 and lens 542. A beam of optical energy 550' is then passed through second particle shield 530' and photomask 540. A beam of optical energy 550" is then passed through third particle shield 530" and imaging module 546. A fluid 560 fills at least a space between imaging module 546 and a wafer 570. In some embodiments, each of first particle shield 530, second particle shield 530' and third particle shield 530" independently includes a gas fluid or the velocity dependent force. In some embodiments, photolithography system 500 includes apparatus 100, 100', 100", 200, 200', 300, or combinations therefor.

In some embodiments, photolithography system 500 is an immersion photolithography system. In some embodiments, similar to photolithography system 400, each of first particle shield 530, second particle shield 530' and third particle shield 530" include the energy gradient force, the velocity dependent force, or combinations thereof. In at least one embodiment, when first particle shield 530, second particle shield 530' and third particle shield 530" consist of gas fluid, a photon transmission loss between the beam of optical energy 550 and 550' ranges from about 0.011% to about 0.033%. In various embodiments, depending on a requirement of cleanliness, one or more sets of components are positioned on selected surfaces in photolithography system 500.

In some embodiments, apparatus 100, 100', 100", 200, 200', 300 is arranged above selected surface during other manufacturing process line, such as a standard mechanical interface (SMIF) pod station or a spectra critical dimension equipment, photoresist spinner, or wet spray etcher.

One aspect of this description relates to an apparatus for generating a plurality of particle shields. The at least one particle shield includes a first component and a second component. The first component and the second component are usable to form a first particle shield of the at least one particle shield for blocking particles from contacting a proximate surface of an object, the first particle shield is substantially parallel to and physically separated from the proximate surface of the object, and the first particle shield includes an energy gradient force or a velocity gradient force.

Another aspect of this description relates to a photolithography system. The photolithography system includes a photomask, a slit, at least one optical element, a first apparatus generating a first particle shield, and a second apparatus generating a second particle shield, wherein the slit is between the first particle shield and the second shield.

Still another aspect of this description relates to a method for photolithography in semiconductor manufacturing. The method includes positioning a shield generator between a photomask and a slit, forming a particle shield by the shield generator to help prevent particles from adhering to a surface of the photomask or a surface of the slit, and remove the particles along an optical path, wherein the shield generator is between the photomask and the slit, and performing an exposure to transfer one or more patterns in the photomask onto a substrate or a layer on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for generating at least one particle shield comprising:
   a first component and a second component, wherein the first component and the second component are usable to form a first particle shield of the at least one particle shield for blocking particles from contacting a proximate surface of an object, at least one of the first component and the second component is moveable along a direction orthogonal to the proximate surface of the object, the first particle shield is substantially parallel to and physically separated from the proximate surface of the object, and the first particle shield includes an energy gradient force or a velocity dependent force.

2. The apparatus of claim 1, wherein the first component comprises at least one gas injector.

3. The apparatus of claim 2, wherein the second component comprises at least one gas extractor corresponding to the at least one gas injector in the first component.

4. The apparatus of claim 1, wherein an area of the first particle shield is greater than an area of the proximate surface.

5. The apparatus of claim 1, further comprising:
   a third component and a fourth component, wherein the third component and the fourth component are usable to form a second particle shield of the at least one particle shield for blocking particles from contacting the proximate surface of the object, the second particle shield is physically separated from the proximate surface of the object and the second particle shield includes an energy gradient force or a velocity dependent force.

6. The apparatus of claim 5, wherein the first component, the second component, the third component and the fourth component are movable along the direction orthogonal to the proximate surface of the object.

7. The apparatus of claim 5, wherein the second component is parallel with the first component, the fourth component is parallel with the third component, and the third component and the fourth component are transverse to the first component and the second component.

8. The apparatus of claim 5, wherein the first component is configured to generate an air curtain, and the third component and the fourth component are configured to generate a magnetic field.

9. The apparatus of claim 1, wherein a thickness of the first particle shield ranges from about 1 millimeter (mm) to about 90 mm.

10. The apparatus of claim 1, wherein the object is a substrate or a reticle.

11. The apparatus of claim 1, wherein the first particle shield comprises a first surface substantially parallel to the proximate surface of the object and a second surface having an angle relative to the proximate surface of the object, wherein the angle ranges from about 5 degrees to about 11 degrees.

12. The apparatus of claim 1, wherein the first particle shield comprises at least one of a thermal gradient driving force, an electromagnetic Lorentz force or an optical laser.

13. The apparatus of claim 1, wherein the first particle shield has an oval shape from a top view.

14. A photolithography system comprising:
   a photomask;
   a slit;
   at least one optical element;
   a first apparatus generating a first particle shield; and
   a second apparatus generating a second particle shield, the first particle shield, the slit, and the second particle shield being spaced away from each other along a first direction, wherein the slit is between the first particle shield and the second particle shield, wherein the first particle shield is offset from the second particle shield in a second direction perpendicular to the first direction, and wherein the first particle shield and the second particle shield include different gases.

15. The photolithography system of claim 14, wherein a distance between the photomask and the slit ranges from about 10 millimeters (mm) to about 100 mm.

16. The photolithography system of claim 14, wherein an area of the first particle shield and the second particle shield is equal to or greater than six inches by six inches.

17. The photolithography system of claim 14, wherein a thickness of the first particle shield or the second particle shield ranges from about 1 millimeter (mm) to about 35 mm.

18. The photolithography system of claim 14, further comprising
   a radiation source;
   a set of optical apertures; and
   a plurality of reflectors, wherein a beam of optical energy generated from the radiation source propagates along an optical path to the plurality of reflectors, the slit and the set of optical apertures.

19. The photolithography system of claim 18, wherein a transmission loss of the beam of optical energy ranges from about 0.011% to about 0.022%.

20. A method for photolithography in semiconductor manufacturing, comprising:
   positioning a shield generator between a photomask and a slit, wherein the shield generator includes a gas injector and a gas extractor;
   forming a particle shield by the shield generator to help prevent particles from adhering to a surface of the photomask or a surface of the slit, and remove the particles along an optical path, wherein the shield generator is between the photomask and the slit, wherein the particle shield has an oval shape from a top view and the oval shape has a minor axis aligned with a direction pointing from the gas injector to the gas extractor; and
   performing an exposure to transfer one or more patterns in the photomask onto a substrate or a layer on the substrate.

* * * * *